US011119125B2

United States Patent
Claeys

(10) Patent No.: US 11,119,125 B2
(45) Date of Patent: Sep. 14, 2021

(54) TOROIDAL FLUXGATE CURRENT TRANSDUCER

(71) Applicant: LEM International SA, Plan-les-Ouates (CH)

(72) Inventor: Stéphane Claeys, Chevrier (FR)

(73) Assignee: LEM International SA, Plan-les-Ouates (CH)

(*) Notice: Subject to any disclaimer, the term of this patent is extended or adjusted under 35 U.S.C. 154(b) by 0 days.

(21) Appl. No.: 16/769,145

(22) PCT Filed: Dec. 5, 2018

(86) PCT No.: PCT/EP2018/083692
§ 371 (c)(1),
(2) Date: Jun. 2, 2020

(87) PCT Pub. No.: WO2019/110687
PCT Pub. Date: Jun. 13, 2019

(65) Prior Publication Data
US 2020/0379017 A1 Dec. 3, 2020

(30) Foreign Application Priority Data
Dec. 8, 2017 (EP) .................................. 17206067

(51) Int. Cl.
*G01R 19/00* (2006.01)
*G01R 15/18* (2006.01)
(Continued)

(52) U.S. Cl.
CPC .......... *G01R 15/185* (2013.01); *G01R 19/00* (2013.01); *G01R 19/0084* (2013.01);
(Continued)

(58) Field of Classification Search
CPC ............ G01R 19/0092; G01R 19/0084; G01R 19/00; G01R 19/165; G01R 21/00;
(Continued)

(56) References Cited

U.S. PATENT DOCUMENTS

2013/0154629 A1* 6/2013 Gudel .................... G01R 33/04
324/225
2015/0293157 A1 10/2015 Weller
(Continued)

FOREIGN PATENT DOCUMENTS

DE 102012216553 3/2014
EP 2423693 2/2012
(Continued)

OTHER PUBLICATIONS

International Search Report and Written Opinion issued by the European Patent Office, dated Mar. 14, 2019, for International Patent Application No. PCT/EP2018/083692; 12 pages.
(Continued)

*Primary Examiner* — Raul J Rios Russo
(74) *Attorney, Agent, or Firm* — Faegre Drinker Biddle & Reath LLP

(57) ABSTRACT

Closed loop current transducer includes a fluxgate sensing unit, a compensation coil wound around the fluxgate sensing unit, and a transducer housing mounted around the compensation coil, the fluxgate sensing unit comprising a fluxgate housing, a ring-shaped fluxgate magnetic field detector mounted in the fluxgate housing, and a magnetic shield mounted in the fluxgate housing, the magnetic shield surrounding the fluxgate magnetic field detector. The fluxgate housing includes first and second central parts, each central part comprising a radially inner side wall, a radially outer side wall and a base wall joining the inner side wall to the outer side wall, a sensor housing portion being formed on
(Continued)

one side of the base wall and receiving the fluxgate magnetic field detector therein.

12 Claims, 6 Drawing Sheets

(51) Int. Cl.
    *G01R 33/00*     (2006.01)
    *G01R 33/04*     (2006.01)
    *H01F 27/28*     (2006.01)
    *G01R 19/165*     (2006.01)
    *G01R 21/00*     (2006.01)
    *G01R 31/40*     (2020.01)

(52) U.S. Cl.
    CPC ....... *G01R 19/0092* (2013.01); *G01R 19/165* (2013.01); *G01R 21/00* (2013.01); *G01R 31/40* (2013.01); *G01R 33/0017* (2013.01); *G01R 33/04* (2013.01); *H01F 27/2895* (2013.01); *H01L 2924/00* (2013.01); *H01L 2924/0002* (2013.01)

(58) Field of Classification Search
    CPC .. G01R 31/40; G01R 15/185; G01R 33/0017; G01R 33/04; G01R 15/183; H01L 2924/00; H01L 2924/0002; H01F 27/2895
    USPC .......................................... 324/76.11–76.83
    See application file for complete search history.

(56) References Cited

U.S. PATENT DOCUMENTS

2017/0219632 A1*   8/2017   Teppan ................... H01F 38/30
2018/0137969 A1*   5/2018   Hamamura ........ G01R 33/0076

FOREIGN PATENT DOCUMENTS

EP          2980597         2/2016
WO       2006129389     12/2006

OTHER PUBLICATIONS

International Preliminary Report on Patentability issued by the International Bureau of WIPO, dated Jun. 9, 2020, for International Patent Application No. PCT/EP2018/083692; 9 pages.

* cited by examiner

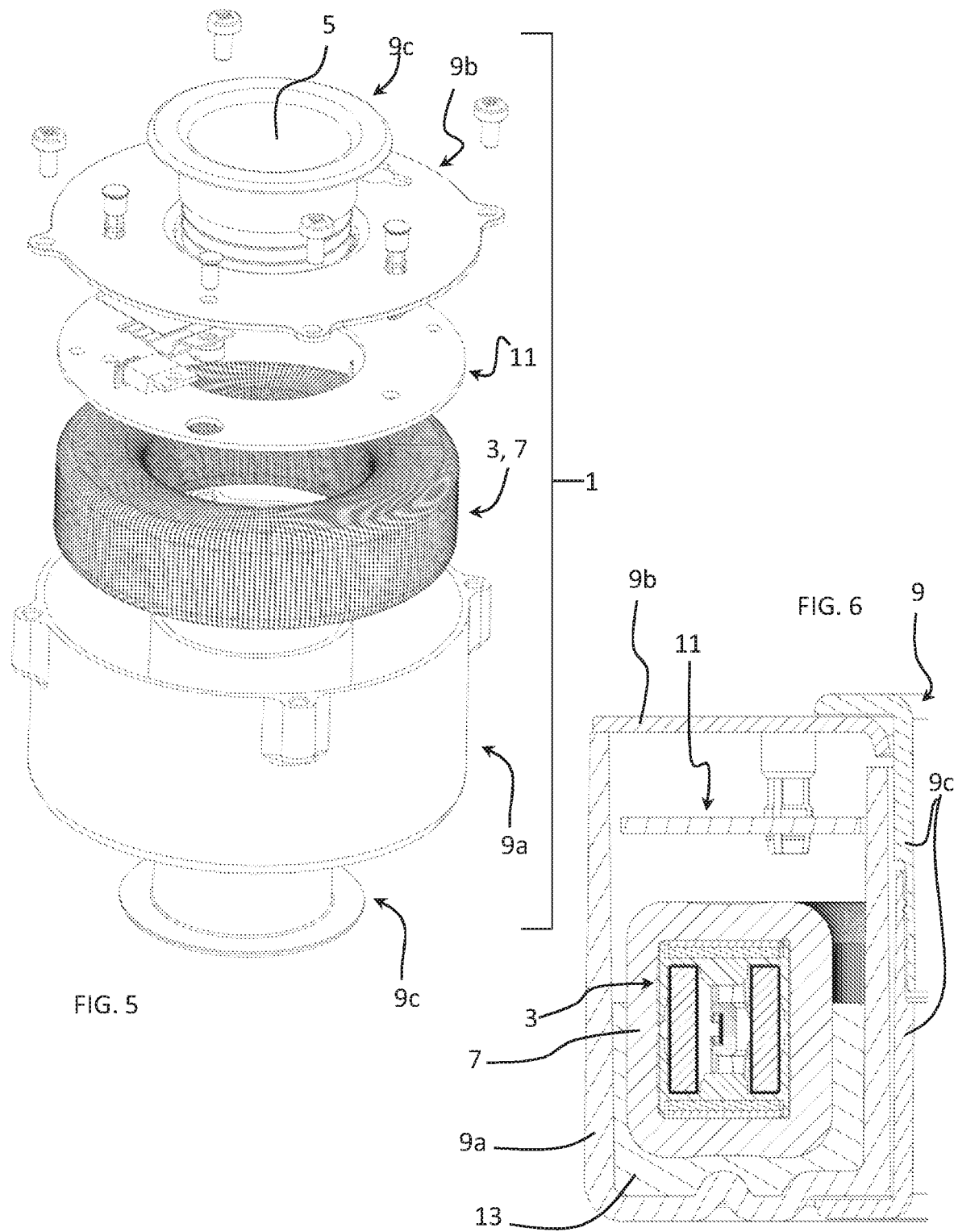

TOROIDAL FLUXGATE CURRENT TRANSDUCER

CROSS-REFERENCE TO RELATED APPLICATIONS

The present application is a national stage entry of International (PCT) Patent Application Number PCT/EP2018/083692, filed Dec. 5, 2018, which in turn claims priority to European Patent Application No. 17206067.5, filed Dec. 8, 2017, the subject matter of which are expressly incorporated herein by reference.

The present invention relates to a toroidal fluxgate current transducer with a secondary coil for closed-loop applications.

Fluxgate transducers have a saturable magnetic core surrounded by an excitation coil that applies an alternating magnetic field that alternatingly saturates the magnetic core. In the presence of an external magnetic field, a bias is applied on the saturation of the saturable magnetic core that affects the symmetry of the excitation signal. This asymmetry is correlated to the amplitude of the external magnetic field and can thus be used to read the amplitude of the external magnetic field. In magnetometers, the excitation current is processed by an electronic circuit that generates a feedback signal to a secondary coil (also called a compensation coil) wound around the fluxgate transducer, or to a magnetic circuit coupled to the fluxgate transducer. The compensation current seeks to cancel the effect of the external magnetic field, whereby the secondary (or compensation) current thus represents the magnitude of the magnetic field. In current transducers, the magnetic field is generated by a primary current (the current to be measured) flowing in a primary conductor. The primary conductor is typically positioned passing through a magnetic circuit formed by or coupled to the magnetic field transducer.

Certain known fluxgate transducers have an annular shape that surrounds a central aperture through which the primary conductor passes. Fluxgate transducers have a high sensitivity and are thus well adapted to measure small currents, or small amplitude differential currents, however they are relatively costly to manufacture and implement in comparison to open-loop current transducers or closed-loop current transducers based on Hall effect magnetic field detectors. Factors influencing the cost of current transducers based on the fluxgate principle, are the provision of the excitation coil and the secondary coil, the provision of the saturable magnetic core and the interconnection of the coils to an electronic circuit. Some of the aforementioned factors have been addressed by the fluxgate transducer described in EP2609434. There is however a continuing need to further reduce manufacturing costs without reducing the reliability and accuracy of the transducer. There is also an advantage in increasing the compactness of electrical current transducers without decreasing the current measurement range.

An object of this invention is to provide a closed-loop current transducer based on a toroidal fluxgate magnetic field detector that is accurate, reliable and economical to manufacture.

It would be advantageous to provide a closed-loop toroidal fluxgate current transducer that is economical to manufacture in large series.

It would be advantageous to provide a closed-loop toroidal fluxgate current transducer that is compact.

It would be advantageous to provide a closed-loop toroidal fluxgate current transducer that is robust.

Objects of this invention have been achieved by providing the closed-loop toroidal fluxgate current transducer according to claim 1.

Disclosed herein is a closed loop current transducer comprising a fluxgate sensing unit, a compensation coil wound around the fluxgate sensing unit, and a transducer housing mounted around the compensation coil, the fluxgate sensing unit comprising a fluxgate housing, a ring-shaped fluxgate magnetic field detector mounted in the fluxgate housing, and a magnetic shield mounted in the fluxgate housing. The magnetic shield surrounds the fluxgate magnetic field detector. The fluxgate housing comprises first and second central parts, each central part comprising a radially inner side wall, a radially outer side wall and a base wall joining the inner side wall to the outer side wall, a sensor housing portion being formed a first side of the base wall and receiving the fluxgate magnetic field detector therein. The magnetic shield comprises an inner annular shield element, an outer annular shield element, a first axial end shield element and a second axial end shield element, the inner and outer annular shield elements are mounted within the sensor housing portion, and the axial end shield elements are mounted in a shield lodging portion formed in the fluxgate housing on a second side of the base wall opposite to the first side.

In an advantageous embodiment, the first and second fluxgate housing central parts are identical.

In an advantageous embodiment, the outer annular shield element and the inner annular shield element are essentially cylindrical tubular shaped parts.

In an advantageous embodiment, the axial end shield elements are substantially planar disc shaped parts with central passages.

In an advantageous embodiment, each fluxgate housing central part may comprise a plurality of circumferentially distributed radial guide tabs upstanding from the base wall, said radial guide tabs configured to engage opposed radially inner and radially outer sides of the fluxgate magnetic field detector.

In an advantageous embodiment, the radial guide tabs are in the form of elastic cantilever beams.

In an advantageous embodiment, ribs are provided on an inner side of the fluxgate housing radially outer side wall configured for engaging in an interference fit with the outer annular shield element.

In an advantageous embodiment, the radially inner side wall of the fluxgate housing central part is provided with ribs configured for engaging in an interference fit with the inner annular shield element.

In an advantageous embodiment, the fluxgate housing further comprises first and second cover parts in the form substantially of annular discs with central passages configured for assembly between the radially inner and radially outer side walls of the fluxgate housing central parts at opposed axial ends of the fluxgate housing to cover the axial end shields.

In an advantageous embodiment, the spacer tabs are provided within the sensor housing portion upstanding from the base wall configured to engage in an interference fit the outer annular shield element and inner annular shield element.

In an advantageous embodiment, the axial end shield lodging portion of the fluxgate housing comprises a plurality of fixing studs extending through fixing orifices in the axial end shields configured to position and secure the end shield to the base wall.

In an advantageous embodiment, the fluxgate magnetic field detector comprises a saturable magnetic core mounted on a ring shaped dielectric support, an excitation coil wound around the ring shaped dielectric support and saturable magnetic core.

The terms "toroidal" and "ring" used herein are not limited to circular shapes but encompass square, rectangular, polygonal, elliptical or any regular or irregular closed shape surrounding an aperture to allow one or more primary conductors to pass therethrough.

Further objects and advantageous features of the invention will be apparent from the claims and the following detailed description of embodiments of the invention in relation to the annexed drawings.

FIG. 5 is a exploded perspective view of a transducer according to an embodiment of the invention;

FIG. 6 is a cross-sectional view of the transducer according to the embodiment of FIG. 5.

Figure 1:
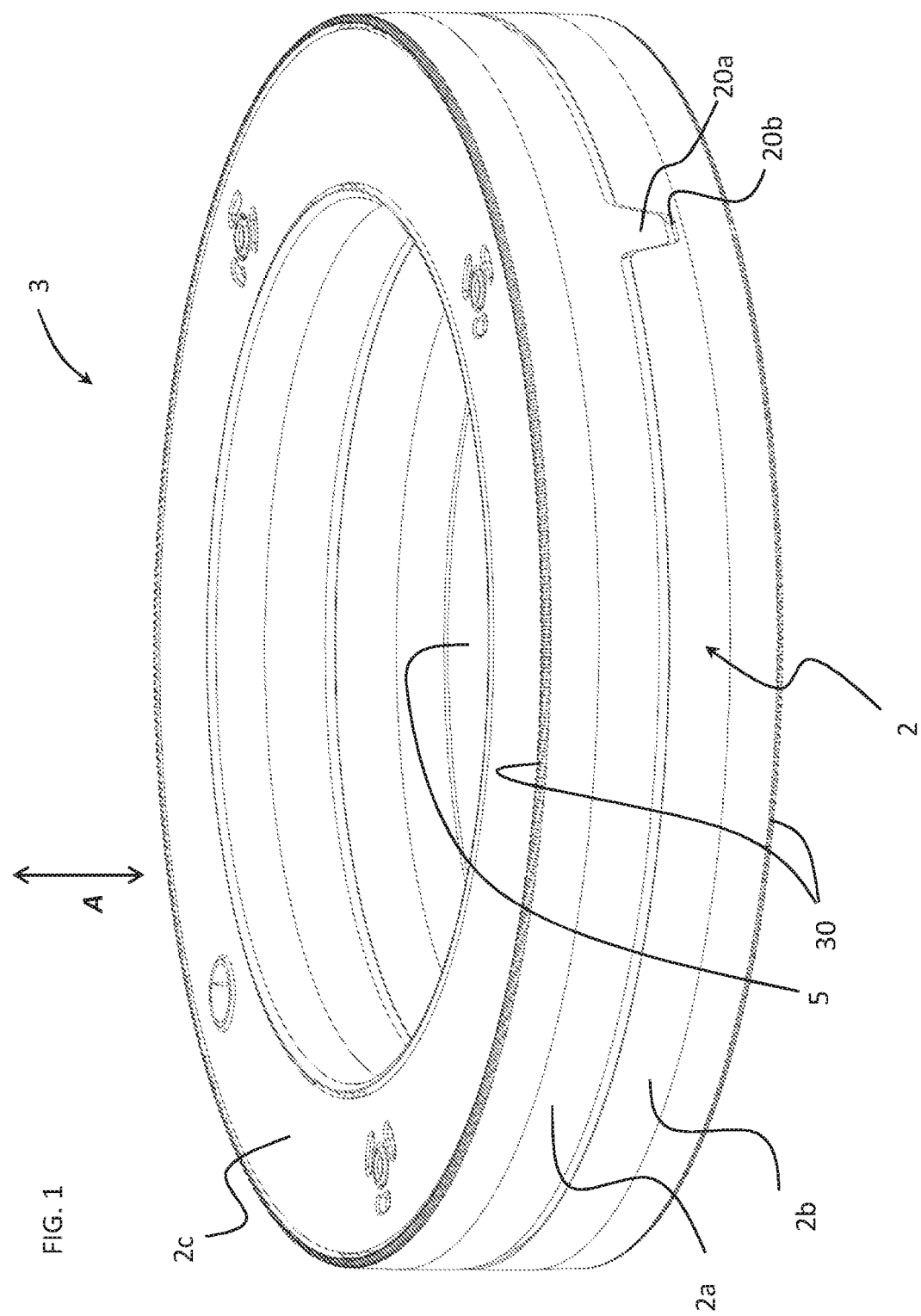
FIG. 1 is a perspective view of a fluxgate sensing unit of a toroidal current transducer according to an embodiment of this invention.

Referring to the figures, a closed-loop current transducer 1 according to an embodiment of the invention comprises a transducer housing 9, a toroidal fluxgate sensing unit 3, a compensation coil wound around the toroidal fluxgate sensing unit 3, and a signal processing circuit 11, for instance provided on a circuit board, connected to the toroidal fluxgate sensing unit 3 and compensation coil 7, for measuring a primary current. The toroidal fluxgate sensing unit 3 with compensation coil 7 wound therearound and signal processing circuit 11 are mounted in the transducer housing 9 and may be held by various means within the transducer housing. In the illustrated embodiment, the toroidal fluxgate sensing unit 3 with compensation coil 7 wound therearound is held within the transducer housing by a potting material 13 partially or completely filling space between the compensation coil and the inner walls of the transducer housing as per se well known in the field of current transducers. The transducer housing 9 may for instance comprise a base 9a to receive the aforementioned components within the housing and a cover 9b to close the open side of the base. However, within the scope of the invention, other transducer housing arrangements such as an injected polymer housing around the components, or a base without cover, where the potting material is completely filled and moulded over the compensation coil and circuit board. In the illustrated embodiment the housing is further provided with centre portions 9c surrounding the central passage 5 and defining the form and dimensions of the central passage.

The transducer 1 comprises a central passage 5 through which extend a primary conductor or a plurality of primary conductors (not shown) carrying the current to be measured, which is commonly referred to as the primary current.

The transducer housing 9 may further include electrical and/or magnetic shielding, as part of the housing, for instance by having metallic housing parts 9a, 9b, or by providing a separate shielding layer (not shown) mounted on or around the housing.

The toroidal fluxgate sensing unit 3 may have a closed circular shape as shown in the figures, or may have other closed shapes such as square, rectangular, polygonal, elliptical or any regular or irregular shape surrounding an aperture to allow the one or more primary conductors to pass therethrough.

The transducer 1 according to this invention may advantageously be employed for measuring a so-called differential current, which is the sum of the currents flowing in multiple primary conductors. This may be used for example to determine leakage in a circuit. For example, a pair of conductors of a closed electrical circuit passing through the central passage 16 would have currents of equal amplitude but opposite direction in a case of normal operation, the magnetic fields generated by the opposing currents cancelling each other out. If there is leakage in the circuit, the supply and return currents would not have an equal amplitude and the resulting difference generates a non null magnetic field that is correlated to the differential current.

The toroidal fluxgate sensing unit 3 comprises a dielectric fluxgate housing 2, a fluxgate magnetic field detector 4, and a shield 6. The toroidal fluxgate sensing unit is further surrounded by a compensation coil 7. The compensation coil is made of a thin conducting wire with an insulating coating that is wound around the dielectric fluxgate housing 2. As is per se well known in closed-loop transducers, the compensation coil is driven by an electronic circuit connected to the magnetic field detector 4 in a feed-back loop, whereby the compensation coil is driven to generate a magnetic field to cancel the effect of the magnetic field generated by the primary current. The amplitude and direction of the secondary current forms a representation of the primary current and can thus be used as a measure of the primary current, which may be a differential current as mentioned above.

The toroidal fluxgate sensing unit 3 comprises a saturable magnetic core 10 that may advantageously be in a form of a strip or band of amorphous magnetic material such as Metglas 2714A that is mounted on a dielectric support ring 12 that is ring shaped and made for example of injected plastic material. The dielectric support ring 12 is preferably made of a single part as illustrated, but may also be made of two or more parts fixed together during assembly of the transducer. The strip of amorphous magnetic material forming the saturable magnetic core may be mounted with an adhesive coated on one side of the strip, or coated on the dielectric support ring 12 or provided on an insulating tape such that the amorphous strip may be bonded to an outer surface of the dielectric support. The strip of amorphous magnetic material may form a single layer on the support, optionally with a certain overlap at the opposed free ends, or form two or more layers on the support, as a single strip wound around the support or as a plurality of separate stacked strips.

An excitation coil 8 is wound around the dielectric support ring 12. The excitation coil may be made of a thin copper wire or other conducting material. In a variant, the toroidal fluxgate sensing unit may be produced as a linear unit, whereby a linear strip or band of amorphous magnetic material is mounted on a linear insulating support and the excitation coil wound therearound, the linear unit then being bent into the final ring shape.

The shield 6 is made of a magnetic material with a high magnetic permeability and serves principally to provide a magnetic shield around the fluxgate magnetic field detector 4.

The fluxgate housing 2 comprises first and second central parts 2a, 2b and first and second cover parts 2c, the central parts and cover parts being assembled together during manufacturing of the sensing unit to form the fluxgate housing 2 in which the fluxgate magnetic field detector 4 and shield 6 is mounted. The central parts 2a, 2b may advantageously, in an embodiment, be identical parts. The central parts 2a, 2b may be provided with orientation elements 20a, 20b, for instance in the form of an axially extending protuberance 20a received in an axially extending recess 20b on the other fluxgate housing central part 2b. In an embodiment where the fluxgate housing part 2a, 2b are identical parts, the fluxgate housing parts may be provided with both a recess 20b and a protuberance 20a diametrically opposed on an outer and/or inner radial side of the fluxgate housing central part 2a, 2b.

Outer axial edges 30 of the fluxgate housing 2 may advantageously be provided with indents that serve to position the first layer of a compensation coil 7 that is wound around the fluxgate sensing unit 3. This helps to prevent slippage between wires of the first layer of winding and ensure an even distribution of subsequent coil layers wound therearound.

The two fluxgate housing cover parts 2c may advantageously be identical parts having a substantially planar ring shape mountable in an axial direction A to opposed axial ends of the fluxgate housing central parts 2a, 2b. In the illustrated embodiment, the cover parts 2c are provided with fixing protuberances 32 extending radially outwardly from an outer radial edge 37 and additionally or alternatively from an inner radial edge 39. The fixing protuberances 32 are configured for an interference fit with the inner surfaces 23, 25 of the central parts 2a, 2b. The fluxgate housing cover parts 2c can thus be assembled and fixed to the corresponding opposed axial ends of the fluxgate housing central parts 2a, 2b by being press-fitted thereagainst. Optionally, the fluxgate housing parts 2a, 2b, 2c may be further bonded or welded together, for instance by means of ultrasonic welding, however such operations may be avoided with the assembly consisting of a press-fit mechanical assembly subsequently followed by a winding of the compensation coil therearound.

Each fluxgate housing central part 2a, 2b comprises a radially inner side wall 14 and a radially outer side wall 16 bridged by a base wall 18. The central part 2a, 2b comprises on one side of the base wall a sensor housing portion 22 and on the other side of the base wall 18 a shield lodging portion 28. The shield lodging portion 28 provides an axial recess that is configured to receive a substantially planar axial end shield 6c therein as well as the fluxgate housing cover part 2c, adjacent the outer axial edge 30. In the shield lodging portion 22, fixing studs 40 may be provided upstanding from the base wall 18, configured to be received in corresponding orifices 46 of the axial end shield 6c and optionally in fixing orifices 34 of the fluxgate housing cover part 2c. The fixing orifices 34 in the fluxgate housing cover part may be provided with hooks or protuberances configured for an interference fit with the fixing studs 40 in order to provide further secure fixing of the fluxgate housing cover part 2c to the corresponding fluxgate housing central part 2a, 2b. In a variant, the fixing studs 40 upstanding from the base wall 18 may also be hot riveted around the corresponding fixing orifice 46 of the axial end shield 6c. A stable, robust and secure anchoring of the axial end shield within the fluxgate housing 2 is thus ensured.

The fluxgate housing base wall may further be provided with a wire through channel 42 that is aligned with a wire orifice 44 in the axial end shield 6c to allow connection ends 8a of the excitation coil 6 to extend therethrough for connection to electronic circuitry outside of the fluxgate sensing unit 3.

The magnetic shield 6 comprises an outer annular shield 6b, an inner annular shield 6a, and first and second axial end shields 6c extending over opposed axial ends of the inner and outer annular shield elements 6a, 6b. The shield elements 6a, 6b, 6c thus surround the fluxgate magnetic field detector 4 to attenuate the amplitude of a magnetic field outside of the shield on the fluxgate magnetic field detector positioned within the shield.

The general functioning principle of a magnetically shielded fluxgate detector is per se known in the art and need not be described in detail herein.

Advantageously, according to an aspect of the invention, the outer and inner annular shield elements 6a, 6b are simple ring shaped elements that correspond to sections of cylindrical tubes that are easy and inexpensive to manufacture. The axial end shields substantially in the form of planar discs with a central orifice are also easy and inexpensive to manufacture. Moreover, the outer and inner annular shield elements 6a, 6b may be mounted within the fluxgate housing in an axial direction A which corresponds to the mounting direction of the fluxgate magnetic field detector 4 within the fluxgate housing central parts 2a, 2b, and the axial end shields 6c and fluxgate housing cover parts 2c to the fluxgate housing central parts.

Figure 2:
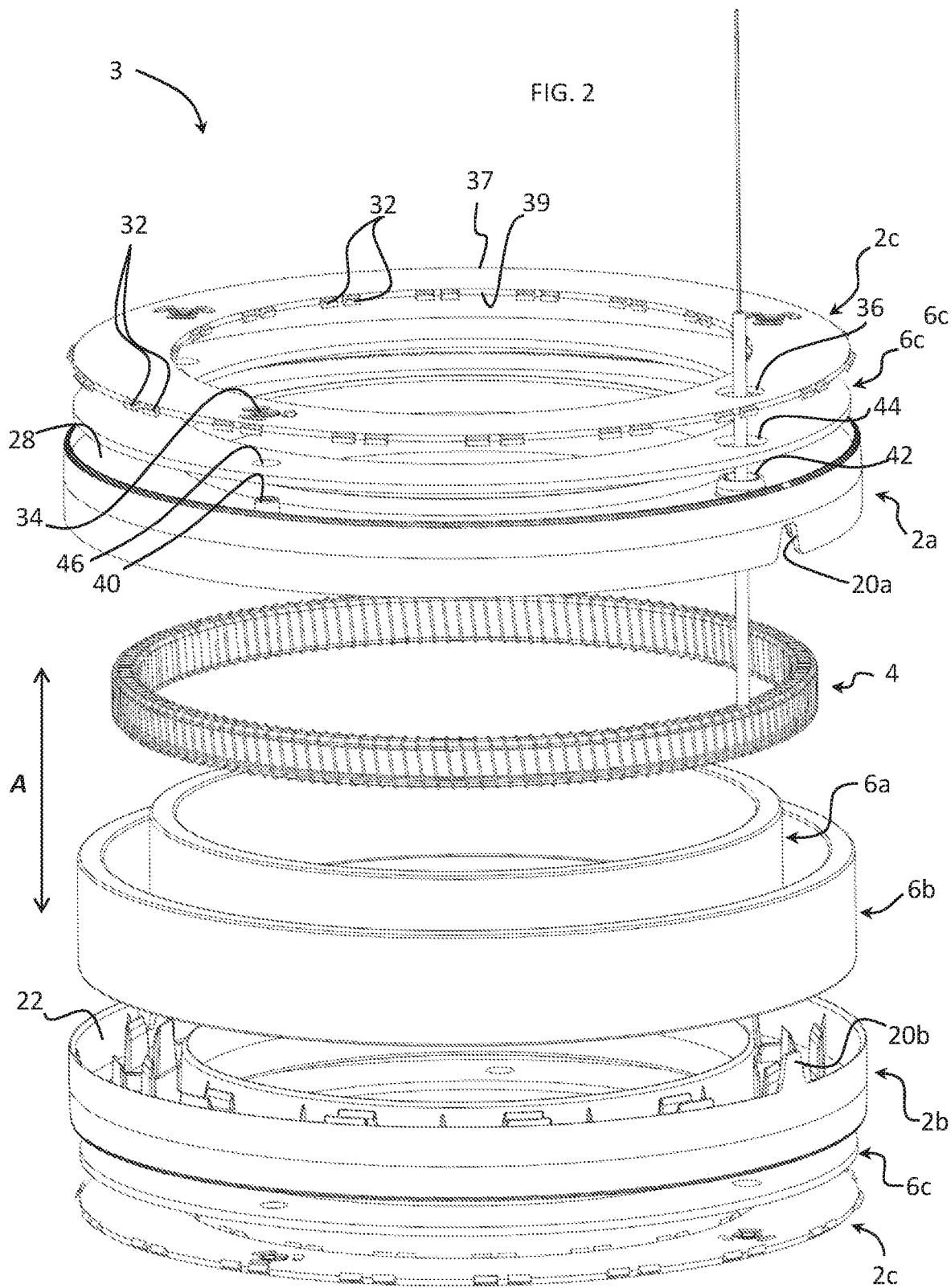
FIG. 2 is a perspective exploded view of the embodiment of FIG. 1.

As may be best understood referring to FIG. 2, the various components mentioned above may be assembled together in a stacked relationship in an axial direction that simplifies the assembly process. Moreover, the shield provided with outer and inner annular elements 6a, 6b is particularly compact compared to conventional devices.

Figure 3A:
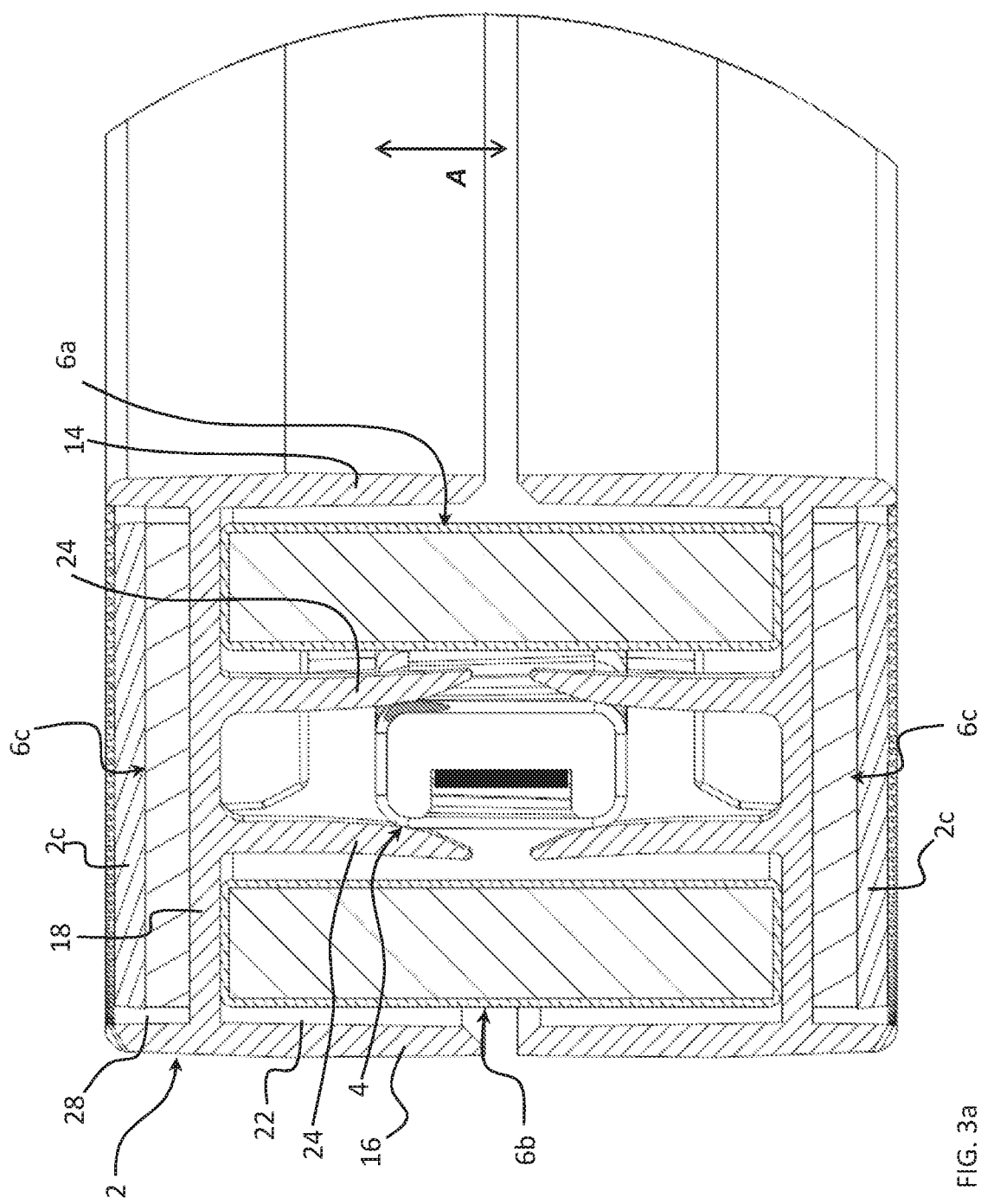
FIGS. 3a and 3b are cross-sectional views of the embodiment of FIG. 1.
Figure 3B:
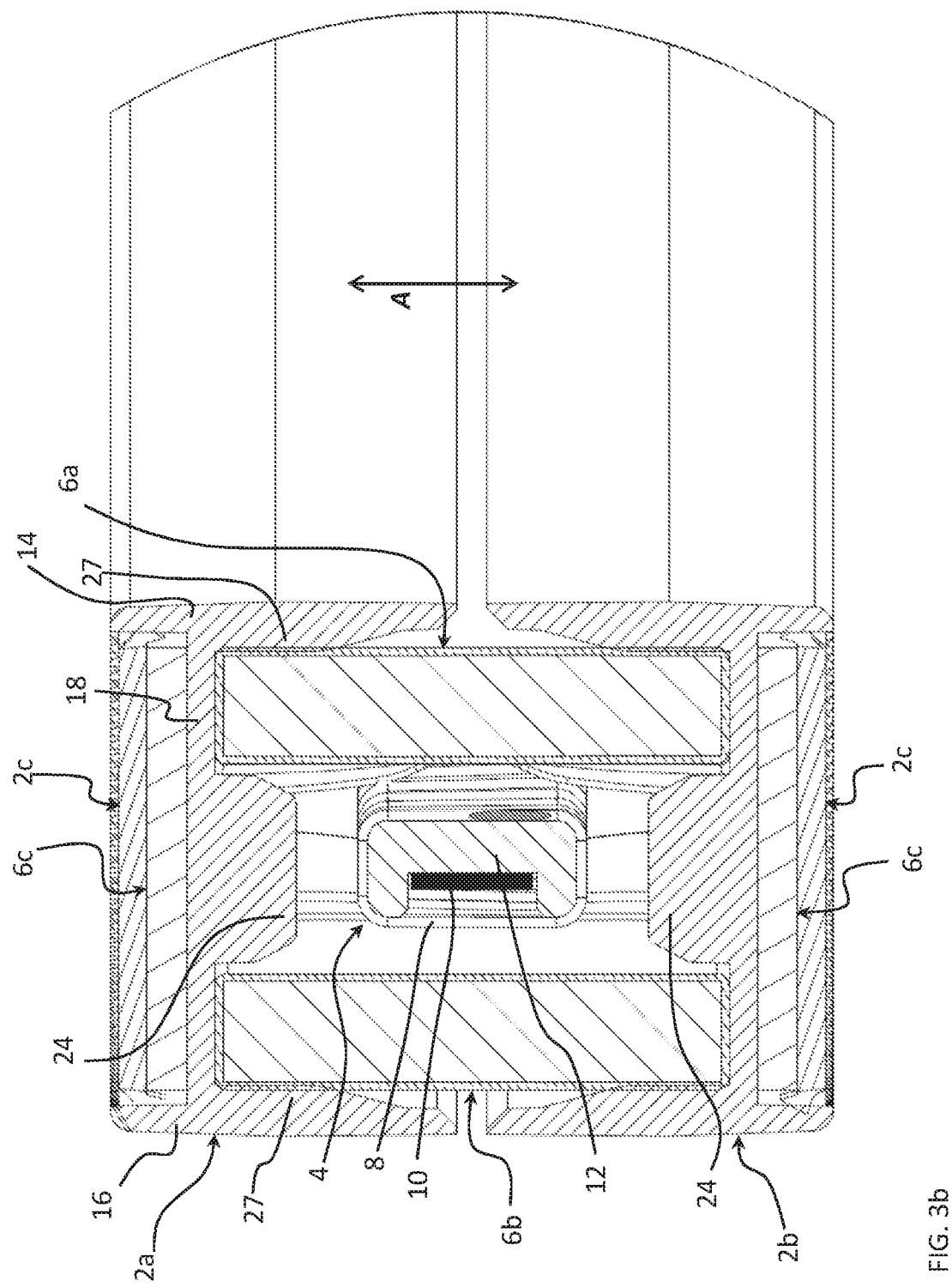
Figure 4:
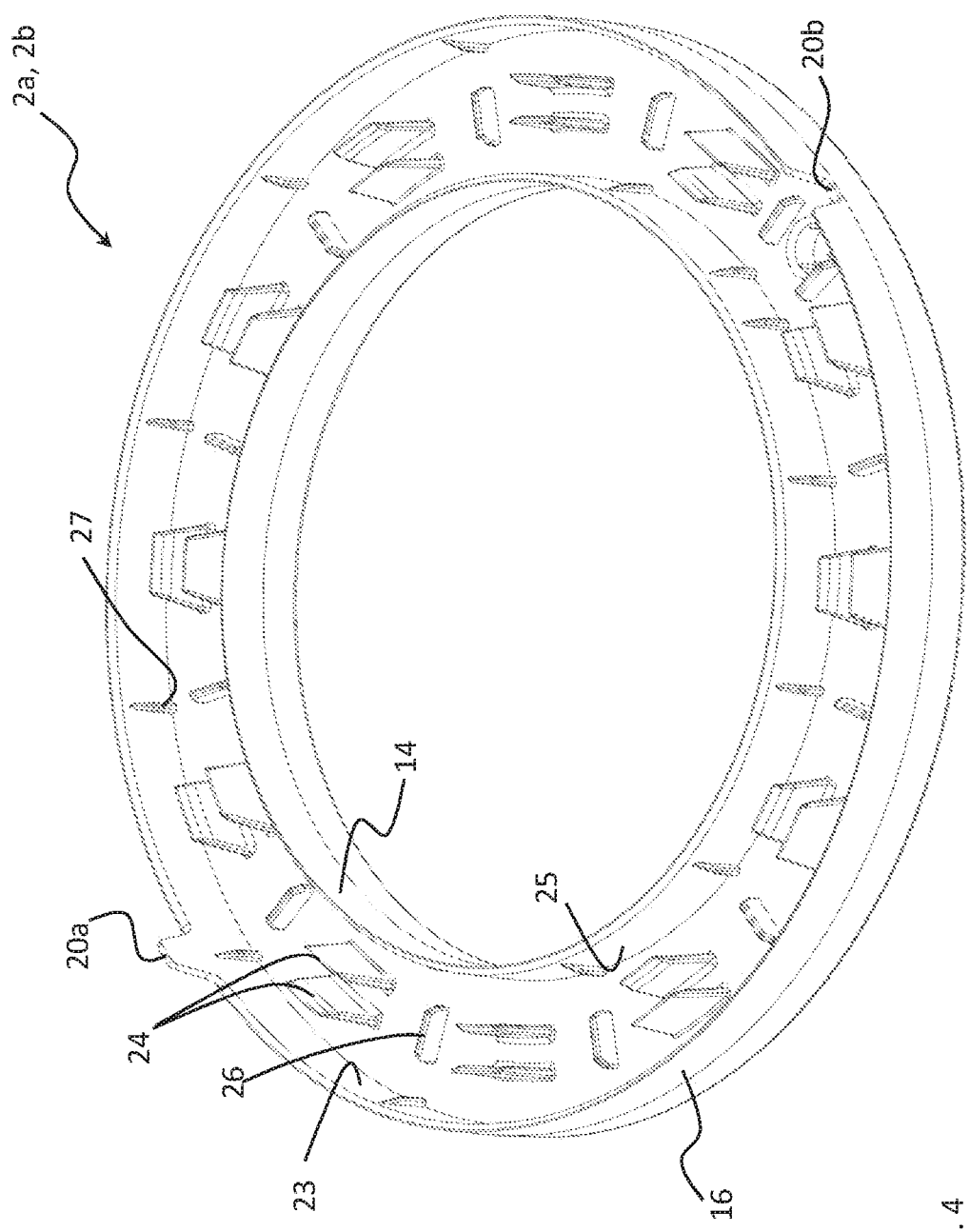
FIG. 4 is a perspective view of a fluxgate housing central part of the fluxgate sensing unit according to an embodiment of this invention.

Referring in particular to FIGS. 3a, 3b and 4, each fluxgate housing central part 2a, 2b comprises, within the sensor housing portion 22, radial guide tabs 24 upstanding from the base wall 18 that are configured to engage radially inner and radially outer corners or sides of the ring shaped fluxgate magnetic detector 4, thus securely positioning the fluxgate magnetic field detector 4 within the fluxgate housing and between the outer and inner annular shield elements 6a, 6b of the shield 6. The radial guide tabs 24 may advantageously be in the form of elastic tongues that exert an elastic biasing force against the fluxgate magnetic field detector 4. The radial guide tabs 24 may advantageously be provided with a slightly tapered or chamfered entry portion to ease entry and positioning of the fluxgate magnetic field detector 4 between the tabs with a self-centering effect.

The fluxgate housing parts 2a, 2b, 2c may advantageously be made of an injected or moulded plastic. The radial guide tabs 24 thus provide dielectric separation of the magnetic field detector 4 from the outer and inner shield elements 6a, 6b. The outer and inner shield elements 6a, 6b may be positioned between the upstanding radial guide tabs 24 and respective radially inner and radially outer side walls 14, 16.

The radially inner and radially outer side walls 14, 16 may advantageously be provided with radially extending ribs 27 that are configured to be in an interference fit with the corresponding radially inner and radially outer surface of the corresponding inner respectively outer annual shield elements 6a, 6b. The fixing ribs 27 thus securely fasten the inner and outer annular shield elements 6a, 6b within the fluxgate housing central parts 2a, 2b and also with respect to the fluxgate magnetic field detector 4 whereby the ribs 27 allow axial assembly of the fluxgate housing central parts 2a, 2b from opposite axial sides of the outer and inner annular shield element 6a, 6b as well as from opposite axial ends of the fluxgate magnetic field detector 4.

The fluxgate housing central parts 2a, 2b may further be provided with spacer tabs 26 upstanding from the base wall 18 that are directed essentially in a radial direction and configured to be inserted between the radially inner surface of the outer annular shield element 6b and the radially outer surface of the inner annular shield element 6a, thus providing further robust accurate positioning means for stabilizing the position of the outer and inner annular shield elements 6a, 6b within the fluxgate housing central parts 2a, 2b.

LIST OF REFERENCES USED IN THE DRAWINGS

Current transducer 1
Transducer housing 9
Base 9a
Cover 9b
Centre portions 9c
Central passage 5
Signal processing circuit (circuit board) 11
Compensation coil 7
Fluxgate sensing unit 3
Fluxgate housing 2
Central part 2a, 2b
Radially inner side wall 14
Radially outer side wall 16
Fluxgate housing positioning elements 20a, 20b
Ribs 27
Base wall 18
Sensor housing portion 22
Radial Guide tab 24
Spacer tab 26
Axial end shield lodging portion 28
Outer axial edge 30
Fixing stud 40
Wire through channel 42
Cover part 2c
Annular disc
Fixing protuberance 32
Fixing orifice 34
Wire orifice 36
Outer radial edge 37
Inner radial edge 39
Fluxgate magnetic field detector 4
Excitation coil 8
Connection ends 8a
Saturable magnetic core 10
Support ring 12
Shield 6
Outer annular shield element 6b
Inner annular shield 6a
Axial end shields 6c
Wire orifice 44
Fixing orifice 46

The invention claimed is:

1. A closed loop current transducer comprising a fluxgate sensing unit, a compensation coil wound around the fluxgate sensing unit, and a transducer housing mounted around the compensation coil, the fluxgate sensing unit comprising a fluxgate housing, a ring-shaped fluxgate magnetic field detector mounted in the fluxgate housing, and a magnetic shield mounted in the fluxgate housing, the magnetic shield surrounding the fluxgate magnetic field detector, the fluxgate housing comprising first and second central parts, each central part comprising a radially inner side wall, a radially outer side wall and a base wall joining the inner side wall to the outer side wall, a sensor housing portion being formed on a first side of the base wall and receiving the fluxgate magnetic field detector therein, characterized in that the magnetic shield comprises an inner annular shield element, an outer annular shield element, a first axial end shield element and a second axial end shield element, the inner and outer annular shield elements being mounted within the sensor housing portion, and the axial end shield elements being mounted in a shield lodging portion formed in the fluxgate housing on a second side of the base wall opposite to the first side.

2. The closed loop current transducer according to claim 1, wherein the first and second fluxgate housing central parts are identical.

3. The closed loop current transducer according to claim 1, wherein the outer annular shield element and the inner annular shield element are essentially cylindrical tubular shaped parts.

4. The closed loop current transducer according to claim 1, wherein the axial end shield elements are substantially planar disc shaped parts with central passages.

5. The closed loop current transducer according to claim 1, wherein each fluxgate housing central part comprises a plurality of circumferentially distributed radial guide tabs upstanding from the base wall, said radial guide tabs configured to engage opposed radially inner and radially outer sides of the fluxgate magnetic field detector.

6. The closed losed loop current transducer according to claim 5, wherein the radial guide tabs are in the form of elastic cantilever beams.

7. The closed loop current transducer according to claim 1, wherein ribs are provided on an inner side of the fluxgate housing radially outer side wall configured for engaging in an interference fit with the outer annular shield element.

8. The closed loop current transducer according to claim 1, wherein the radially inner side wall of the fluxgate housing central part is provided with ribs configured for engaging in an interference fit with the inner annular shield element.

9. The closed loop current transducer according to claim 1, wherein the fluxgate housing further comprises first and second cover parts in the form substantially of annular discs with central passages configured for assembly between the radially inner and radially outer side walls of the fluxgate housing central parts at opposed axial ends of the fluxgate housing to cover the axial end shields.

10. The closed loop current transducer according to claim 1, wherein spacer tabs are provided within the sensor housing portion upstanding from the base wall configured to engage in an interference fit the outer annular shield element and inner annular shield element.

11. The closed loop current transducer according to claim 1, wherein the axial end shield lodging portion of the fluxgate housing comprises a plurality of fixing studs extending through fixing orifices in the axial end shields configured to position and secure the end shield to the base wall.

12. The closed loop current transducer according to claim 1, wherein the fluxgate magnetic field detector comprises a saturable magnetic core mounted on a ring shaped dielectric support, an excitation coil wound around the ring shaped dielectric support and saturable magnetic core.

* * * * *

UNITED STATES PATENT AND TRADEMARK OFFICE
CERTIFICATE OF CORRECTION

PATENT NO. : 11,119,125 B2
APPLICATION NO. : 16/769145
DATED : September 14, 2021
INVENTOR(S) : Stéphane Claeys Page 1 of 1

It is certified that error appears in the above-identified patent and that said Letters Patent is hereby corrected as shown below:

In the Claims

Claim 6 reads as follows:
6. The closed loop current transducer according to claim 5, wherein the radial guide tabs are in the form of elastic cantilever beams.

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*